United States Patent

[11] 3,571,674

[72] Inventors Albert Y. C. Yu
Sunnyvale;
Edward H. Snow, Mt. View, Calif.

[21] Appl. No. 790,317
[22] Filed Jan. 10, 1969
[45] Patented Mar. 23, 1971
[73] Assignee Fairchild Camera and Instrument Corporation
Syosset, L. I., N.Y.

[54] FAST SWITCHING PNP TRANSISTOR
5 Claims, 8 Drawing Figs.

[52] U.S. Cl. .......... 317/235
[51] Int. Cl. .......... H01l 11/06
[50] Field of Search .......... 317/235/22, 235/40.12; 317/235/31

[56] References Cited

UNITED STATES PATENTS

| | | | |
|---|---|---|---|
| 2,929,006 | 3/1960 | Hevlet | 317/235 |
| 3,397,450 | 8/1968 | Bittmann et al. | 317/235 |
| 3,463,971 | 8/1969 | Soshea et al. | 317/235 |
| 3,463,975 | 8/1969 | Biard | 317/235 |

FOREIGN PATENTS

| | | | |
|---|---|---|---|
| 936,812 | 9/1963 | Great Britain | 317/235 |

OTHER REFERENCES

Solid State Electronics, " The Schottky-Barrier-Collector Transistor" by May, Pergamon Press 1968, I.E.D.M. Oct. 1966. pages 613— 619

*Primary Examiner*—Jerry D. Craig
*Attorneys*—Roger S. Borovoy and Alan H. MacPherson

ABSTRACT: The on-off switching time of a PNP transistor is significantly decreased by placing a Schottky Barrier diode in parallel with the collector-base PN junction of the transistor.

INVENTORS
ALBERT Y. C. YU
EDWARD H. SNOW
BY
ATTORNEYS

INVENTORS
ALBERT Y. C. YU
EDWARD H. SNOW
BY
ATTORNEYS

FAST SWITCHING PNP TRANSISTOR

FIELD OF THE INVENTION

This invention relates to fast switching PNP transistors with negligible minority carrier storage in the "on" state. More particularly, this invention relates to PNP transistors with Schottky Barrier diodes shunting their base-collector junctions.

DESCRIPTION OF THE PRIOR ART

Schottky Barrier diodes, that is, devices consisting of a layer of metal attached to a layer of selectively doped semiconductor material, are well known. Usually the semiconductor material is doped with donor impurities to a concentration of about $10^{14}$ to $10^{17}$ atoms per cubic centimeter. In contrast to a $P^+N$ junction where the current is carried predominently by holes, in a Schottky Barrier diode the current is carried predominently by electrons. Because of the lower barrier voltage across a typical Schottky Barrier than across a $P^+N$ junction, the electron current across a Schottky Barrier device is usually several orders of magnitude higher than the electron current across a $P^+N$ junction, for the same total current.

One difficulty in producing Schottky Barrier devices has been that the process necessary to produce a reliable device is costly. However, Jenkins and Wilson, in patent application Ser. No. 790,318 filed Jan. 10, 1969 and assigned to Fairchild Camera & Instrument Corporation, the assignee of this application, disclose a technique for producing reliable Schottky Barrier devices which significantly lowers the cost of these devices relative to the prior art costs. Jenkins and Wilson place a metal adjacent to the semiconductor material, typically silicon, and heat the two contiguous materials to just below their eutectic point for a period of time. The semiconductor diffuses slightly into the metal and a reliable, well defined junction is formed between the two materials.

Jenkins and Wilson use their technique to place Schottky-Barrier layers on the collector region of NPN double-diffused transistors. But Jenkins and Wilson's technique does not work on PNP double-diffused transistors. Basically, the problem is that a metal forms an "ohmic," or nonrectifying, junction with a semiconductor material when the impurity concentration in the semiconductor material is greater than about $10^{19}$ atoms per cubic centimeter. But once the impurity concentration in the semiconductor material drops beneath $10^{17}$ atoms per cubic centimeter, the metal-semiconductor junction behaves not like an ohmic junction but rather like a rectifying junction, the so-called Schottky Barrier junction. Because the diffused N-type region in a double-diffused PNP transistor inherently has an impurity concentration greater than about $10^{18}$ atoms per cubic centimeter and because a Schottky Barrier on P-type semiconductor material usually has undesirably large leakage currents, Schottky-Barriers have not been feasible on PNP devices.

BRIEF SUMMARY OF THE INVENTION

This invention, on the other hand, allows Schottky Barriers to be placed on the base regions of PNP transistors. The resulting Schottky Barriers shunt the base-collector PN junctions of the PNP transistors. As a result, PNP transistors are produced which have negligible minority carrier storage in the "on" state. Consequently, these transistors have very rapid switch-off times compared with conventional PNP transistors.

According to this invention, PNP transistors with Schottky Barriers in parallel with their collector-base junctions are produced by first growing an epitaxial layer of N-type silicon over a P-type monocrystalline silicon substrate. A P-type emitter region is then diffused into the N-type epitaxially-grown base region. Next an $N^+$ contact region is diffused within the epitaxial base region. Then, a metal layer is placed over an exposed surface of the N-type epitaxial base region and this layer is extended to a highly-doped P-type isolation and contact region diffused into the P-type collector. As a result, the metal layer, with a Schottky Barrier between the N-type base region and the metal, effectively parallels the base-collector junction of the transistor. Because the current in the Schottky-Barrier device is predominantly electrons rather than holes, hole storage in the N-type base region while the transistor is turned on is substantially reduced, thus decreasing the time required to switch the transistor from on to off.

Several different PNP transistors using the Schottky Barriers of this invention are shown. Some embodiments extend a region of the Schottky- Barrier metal layer on insulation over a portion of the semiconductor substrate. This metal extension advantageously shapes the electric fields in the underlying substrate to increase the breakdown voltage and the stability of the device and also collects charged particles in and on the insulation. Other embodiments use PNP transistors with laterally-diffused emitter and collector regions.

DETAILED DESCRIPTION OF THE DRAWINGS

Figure 5A:
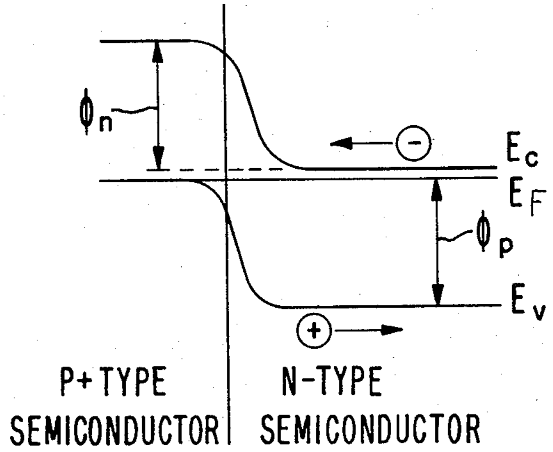
FIGS. 5*a* and 5*b* show the energy band diagrams across a $P^+N$ semiconductor junction and across a Schottky Barrier junction.
Figure 5B:
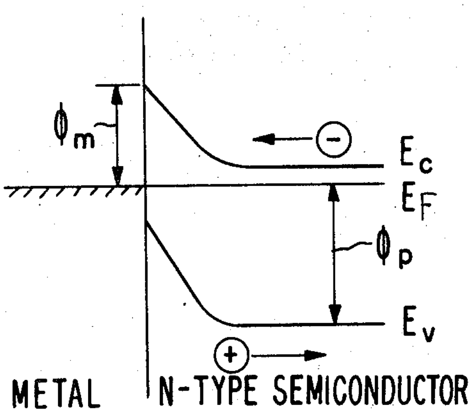

FIGS. 5*a* and 5*b* illustrate the difference between a $P^+N$ junction and a metal-semiconductor Schottky Barrier junction. FIG. 5*a* shows a typical $P^+N$ junction between a $P^+$-type semiconductor material on the left and an N-type semiconductor material on the right. The $P^+$-type semiconductor is typically doped to an impurity concentration of about $10^{19}$ atoms per cubic centimeter or greater while the N-type semiconductor material is doped to a concentration equal to or less than $10^{17}$ atoms per cubic centimeter.

For the junction in static equilibrium, the Fermi level $E_F$ on both sides of the junction must be at the same energy level. Thus $E_F$ is represented by a horizontal line across the junction. In the N-type semiconductor material the Fermi level is quite close to the conduction energy band, represented by the line $E_C$. In the P-type semiconductor material, on the other hand, the Fermi level is quite close to the valence energy band $E_V$. Thus, as shown, the energy bands bend across the PN junction. Consequently, electron energy must be added to an electron to move it from the N-type semiconductor material on the right to the $P^+$-type semiconductor material on the left. Similarly, energy must be added to a hole to move it from the $P^+$-type semiconductor material on the left, up over the potential barrier into the N-type semiconductor material on the right. As shown by Grove, on page 185 of his book, "Physics and Technology of Semiconductor Devices" published in 1967 by John Wiley & Sons, Inc., New York, the current across a $P^+N$ semiconductor junction consists predominantly of holes. This is because the concentration of holes in the $P^+$-type material is so much greater than the concentration of electrons in the N-type material that a larger number of holes successfully cross their potential barrier $\Phi_p$ than do electrons their barrier, $\Phi_n$. Thus, hole storage in the N-type semiconductor material is significant. When the polarity across the $P^+N$ junction is reversed, the time necessary for these holes to migrate back to their $P^+$-type semiconductor material slows the switching time of the junction.

FIG. 5*b*, however, shows the energy band structure across a Schottky Barrier junction. Here, the valence and conduction bands in the metal are approximately at the same energy level as the Fermi level $E_F$. In fact, these energy bands overlap. The Fermi level $E_F$ in the N-type semiconductor, on the other hand, is quite close to the conduction energy band $E_C$. The valence band $E_V$ in the N-type semiconductor material is beneath the Fermi level by the amount $\Phi_p$, the barrier potential to holes moving into the N-type semiconductor from the metal. The potential barrier to the electrons moving to the metal from the N-type semiconductor material is $\Phi_m$, typically 0.7 *ev*. Because the carrier current increases about 1 decade for every 60 milivolts drop in the potential barrier, the drop in the potential barrier across an N-type semiconductor metal junction to 0.7 *ev.* from the 1.0 *ev.* typically associated with a $P^+N$ semiconductor junction results in an increase in electron current by a factor of about $10^5$. As a result, the electron diffusion current across a metal-N-type semiconductor junction is much larger than the hole diffusion current across the same junction. Therefore, the number of holes or minority carriers stored in the N-type semiconductor is very small relative to the number of holes stored in the N-type semiconductor material associated with the $P^+N$ type junction for the same total current across these two junctions. The on-off switching time of the Schottky Barrier is correspondingly much faster than the on-off switching time of a $P^+N$ junction.

In the prior art, Schottky Barriers have been formed on the collector regions of NPN double-diffused transistors. But attempts to place Schottky Barriers on PNP transistors have failed. Part of the problem has been the way in which PNP transistors are formed. A PNP double-diffused silicon transistor comprises a P-type monocrystalline silicon substrate, typically doped to an impurity concentration of $10^{16}$ atoms per cubic centimeter, into which is diffused a base region of N-type conductivity. Using phosphorus as the N-type donor impurity, the impurity concentration of this N-type region is usually no less than $10^{18}$ atoms per cubic centimeter. A region of P-type conductivity is then diffused into the previously diffused N-type region. The impurity concentration of this newly diffused P-type region is typically around $10^{19}$ atoms per cubic centimeter, when boron is the diffusant.

Now a metal forms an ohmic junction with a semiconductor material when the impurity concentration of the semiconductor material is greater than about $10^{19}$ atoms per cubic centimeter. At these concentrations, the semiconductor material is highly conductive and behaves much like a metal. While the barrier potential between the metal and the semiconductor still exists, the region of semiconductor material in which its valence and conduction energy bands are bent in response to the contact potential difference between the metal and the semiconductor material is quite narrow, on the order of just a few angstroms. As a result, electrons moving from the semiconductor material to the metal no longer have to overcome this contact potential difference but rather can "tunnel through" to the metal. Consequently, the contact behaves not like a rectifying junction but rather like an ohmic junction. But once the impurity concentration of the semiconductor material drops beneath $10^{17}$ atoms per cubic centimeter, electrons can no longer "tunnel through" the conduction barrier but rather must be lifted over the conduction barrier. In this situation the metal-semiconductor junction is a rectifying rather than ohmic junction.

Because the diffused N-type base region of a double-diffused PNP transistor has a impurity concentration greater than about $10^{18}$ atoms per cubic centimeter, it has been impossible to form a Schottky Barrier between this region and an overlying metal layer. The resulting junction is neither ohmic nor a good Schottky Barrier.

Furthermore, attempts to form a Schottky Barrier between a metal and the P-type collector region of a double-diffused PNP transistor have also been unsuccessful despite the fact that the impurity concentration of the collector region is usually about $10^{16}$ atoms per cubic centimeter. The reason for this is that many of the metals used in forming the Schottky Barrier behave like acceptor impurities and diffuse into the P-type semiconductor material. This raises the semiconductor impurity concentration in the vicinity of the metal-semiconductor junction above the maximum impurity concentration with which it is possible to form a Schottky Barrier. However, even without diffusion, the potential barrier between the metal and the P-type semiconductor material is only about 0.3 to 0.4 *ev.* Large leakage currents thus flow across the junction making this junction unsuitable for use in a transistor.

Figure 1A:
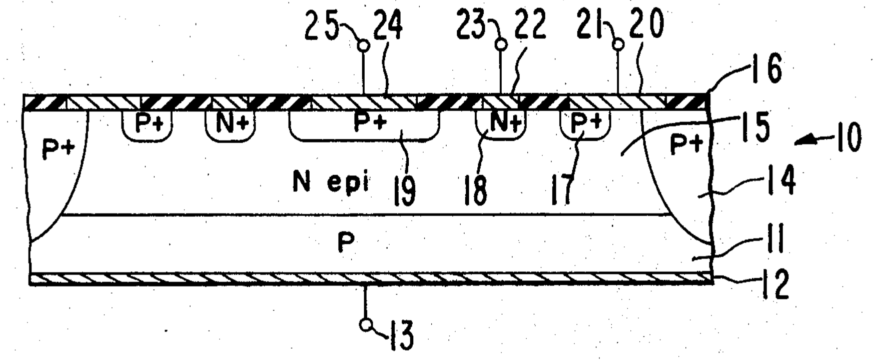
FIGS. 1 through 4 show various embodiments of this invention.
Figure 1B:
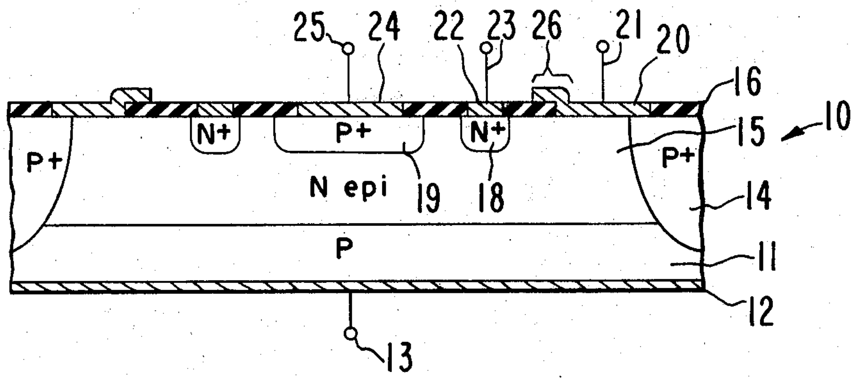

FIGS. 1*a* and 1*b* show typical PNP devices constructed according to the principles of this invention. In both of these FIGS. identical numbers have been used to designate the identical portions of the FIGS. While FIGS. 1*a* and 1*b* show only one transistor device, it should be understood that this device can be merely part of a larger integrated circuit containing numerous active and passive devices.

In FIG. 1*a*, device 10 comprises a P-type monocrystalline substrate 11, on which is grown an N-type epitaxial layer 15 of silicon. P-type region 11 typically has an impurity concentration of about $10^{15}$ to $10^{16}$ atoms per cubic centimeter while epitaxially grown N-type base region 15 has an impurity concentration of no greater than $10^{17}$ atoms per cubic centimeter. Diffused into base region 15 is highly conductive P-type emitter region 19 containing an impurity concentration of about $10^{19}$ atoms per cubic centimeter. Techniques for the epitaxial growth of N-type silicon layer 15 and for the diffusion of P-type impurities into one region of this layer are well known and thus will not be described in detail.

Annular-shaped $P^+$ isolation region 14 is formed around layer 15. Region 14 contacts P-type collector layer 11 and serves to isolate the PNP transistor shown in FIG. 1*a* from the other regions of the integrated circuit substrate. Small annular-shaped $P^+$ region 17 is formed to eliminate high fields near the corner region of contact 20 thereby to improve the breakdown voltage of the Schottky Barrier. $N^+$ contact region 18 is formed in the N-type epitaxial base region to ensure good ohmic contact to the base region. Insulation 16, typically silicon dioxide, silicon nitride, or a combination of these with perhaps a layer of phosphorus glass also, overlies the top surface of wafer 10.

Emitter contact 24, consisting of a layer of metal, typically aluminum, with lead 25 attached, is formed on the surface of emitter region 19 through a window in insulation 16. Base contact 22, consisting of a layer of the same type of metal as emitter contact 24, with lead 23 attached, is likewise formed over $N^+$-type region 18. Usually all metal contact layers are evaporated onto the surface.

To form the collector contact, a region on the surface of the device is cleared of insulation 16. Metal contact layer 20, typically aluminum, is then placed on this surface. Layer 20 covers and adheres to not just a portion of $P^+$region 14, but also portions of base region 15 and guard ring 17. Because the N-type base region of the PNP transistor was epitaxially grown, and has an impurity concentration less than $10^{17}$ atoms per cubic centimeter, the junction between layer 20 and N-type region 15 is a Schottky Barrier. However, because P-type region 14 is highly doped, with a typical impurity concentration greater than $10^{19}$ atoms per cubic centimeter, the junction between layer 20 and P-type region 14 is an ohmic junction. Thus, layer 20 forms a Schottky Barrier device in parallel with the PN junction between base region 15 and collector region 11. If desired, an additional collector contact to this device can be formed by depositing layer 12 of metal on the back side of the substrate. However, the collector contact can be made readily through contact layer 20 and lead 21.

The structure shown in FIG. 1*b* is the same as that shown in FIG. 1*a* except that here the contact layer 20 is extended on insulation layer 16 across base region 15 toward the P-type emitter region 19. Also $P^+$ region 17 has been omitted. Portion 26 of contact layer 20 overlies insulation layer 16 and serves both to shape the field in base region 15 to increase the device breakdown voltage and to collect impurity ions within insulation layer 16. These ions would otherwise collect at the interface between layer 16 and base region 15 and cause inversion channels to form in base region 15. These inversion channels carry leakage current and when they reach the $P^+$ isolation region 14, drastically change the characteristics of the device.

Figure 2:
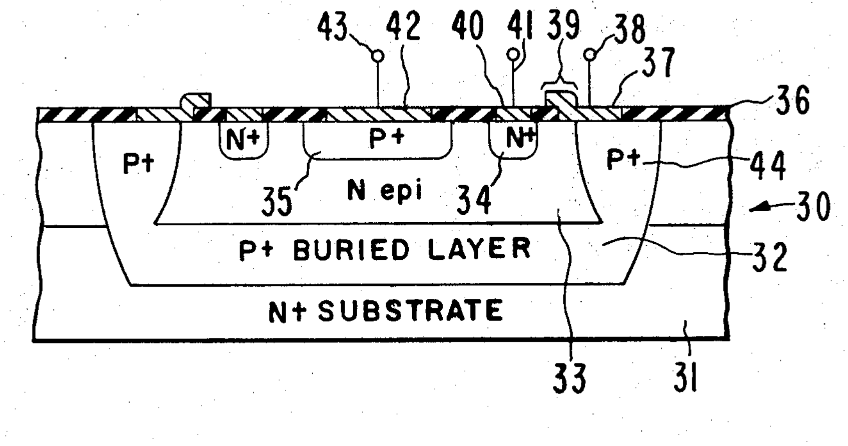
Figure 3A:
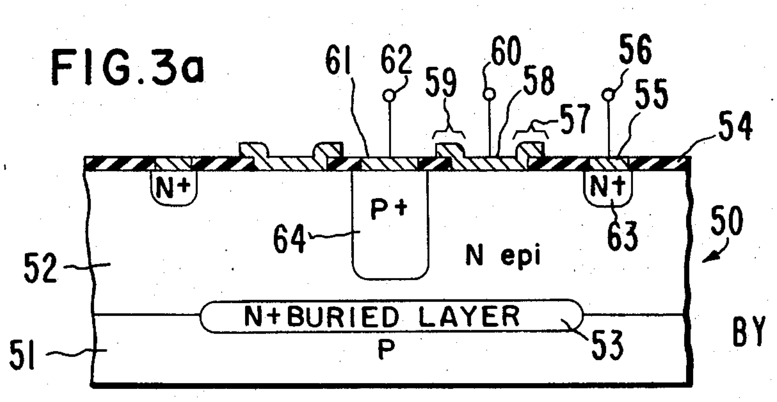
Figure 3B:
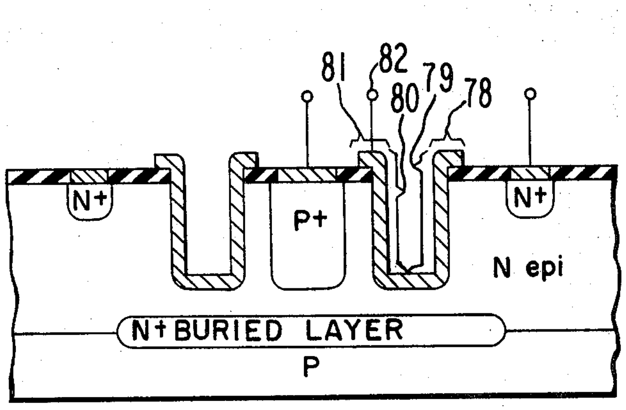

FIG. 2 shows a so-called "self-isolated" PNP transistor, with a buried $P^+$ layer as the collector. In this structure, a highly doped $N^+$ subtrate 31 of monocrystalline silicon has diffused into it along one surface a $P^+$ region 32 with an impurity concentration typically $10^{19}$ atoms per cubic centimeter. On top of $P^+$ region 32 is epitaxially-grown N-type region 33 with an impurity concentration of less than $10^{17}$ atoms per cubic centimeter. Insulation layer 36 is next formed on the surface of wafer 30 over the epitaxially grown silicon 33. Windows are then etched into this insulation. $P^+$-type collector contact region 44 and $P^+$-type emitter region 35 are diffused into the underlying epitaxially grown silicon. Then $N^+$ base contact region 34 is diffused into base region 33 through another window in layer 36.

Metal contact layer 42, shown with lead 43 attached, is evaporated onto a selected portion of the surface of emitter region 35. Metal contact 40, shown with lead 41 attached, is evaporated onto the surface of $N^+$ region 34 to form the base contact. And metal layer 37, shown with lead 38 attached, is evaporated to form the contact to the $P^+$ collector region of the device. But in addition, part of layer 37 extends across the PN junction between the collector region 44 and base region 33 and overlies a portion of base region 33. The junction between base region 33 and metal 37 forms a Schottky Barrier. This Schottky Barrier shunts the base-collector junction of the transistor.

Extended portion 39 of metal layer 37 extends on insulation layer 36 toward the emitter region 35. Portion 39 shapes the electric field at the corner of the Schottky Barrier and thereby increases the breakdown voltage across this barrier. Portion 39 also serves as a charged particle collector, collecting contaminant ions in and on the surface of insulation layer 36. These ions would otherwise migrate to the interface between layer 36 and the underlying semiconductor substrate, there to cause inversion channels to form in the substrate and thereby change the characteristics of the device.

In FIGS. *3a* and *3b* another embodiment of this invention is shown. In these embodiments, the Schottky Barrier serves not merely as a collector contact, but as the collector itself of the PNP device. In these embodiments P-type silicon substrate 51 has diffused into it an $N^+$ region 53 with an impurity concentration of about $10^{19}$ atoms per cubic centimeter. Region 53 serves as a barrier layer to hole current. Grown epitaxially over $N^+$ buried region 53 is N-type base region 52. Emitter region 64 is then diffused into the epitaxially-grown N-type base region 52. A typical impurity concentration for region 64 is about $10^{19}$ atoms per cubic centimeter. Insulation layer 54 is then formed over base region 52. If insulation 54 is silicon dioxide, it is usually formed during the diffusion process. A window is etched in insulation 54 and through this window $N^+$ contact region 63 is diffused into N-type base region 52. Metal contact layers 55, 58 and 61 are then evaporated through windows in layer 54 to form contacts with the $N^+$ contact region 63, N-type base region 52 and P-type emitter region 64, respectively.

Notice that no PN collector junction exists. However, the junction between metal layer 58 and N-type base region 52 serves as a Schottky Barrier because the impurity concentration of base region 52 is less than about $10^{17}$ atoms per cubic centimeter. Consequently, metal layer 58 serves as the collector of the device and thus a PNP transistor has been made from two doped semiconductor regions of opposite conductivity type and an overlying metal contact to the N-type base region. Extended portions 57 and 59 of metal contact 58 serve as field plates to advantageously shape the adjacent electric field to increase Schottky Barrier breakdown voltage and to collect contaminant ions in the underlying insulation.

FIG. *3b* is identical to FIG. *3a* except that here metal contact 58 has been replaced by a metal contact lining an etched groove in the N-type epitaxially-grown region 52. Here metal contact portions 79 and 80 form Schottky Barrier junctions with the underlying epitaxially-grown N-type base region 52. However, the junction between portion 80 of the metal contact and base region 52 (FIG. *3a*) is parallel to part of the PN junction between base region 52 and emitter region 64. This markedly improves the gain of the device in FIG. *3b* relative to the gain of the device in FIG. *3a*. The grooves in base region 52 are etched in a well known manner by using well-known silicon etchants such as CP-4 or CP-6, together with well-known masking and etching techniques. Extended contacts 78 and 81, overlying insulation layer 54, again serve to shape the adjacent electric field to increase the Schottky Barrier breakdown voltage and to collect any contaminant ions on the surface of and within this insulation layer.

Figure 4:
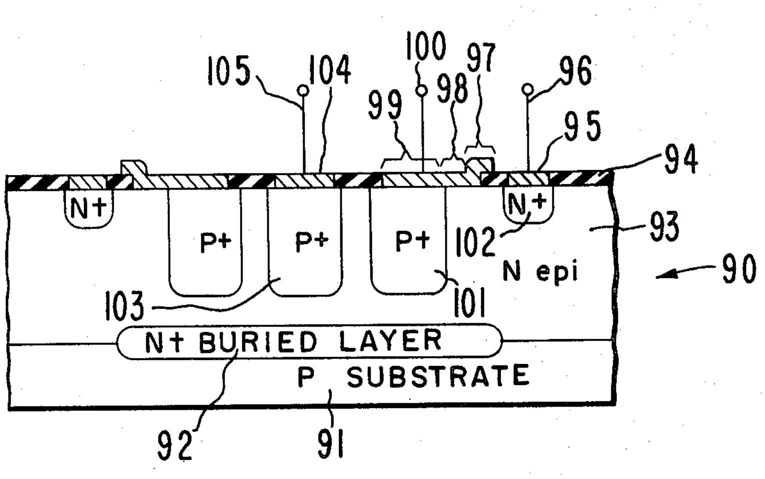

FIG. 4 shows a PNP laterally diffused transistor with a Schottky Barrier junction in parallel with the collector base junction. Here P-type substrate 91 has diffused into it an N+ type buried layer 92. The impurity concentration of layer 92 is typically around $10^{19}$ atoms per cubic centimeter. Layer 92 again serves as a barrier to hole current. Epitaxially grown over substrate 91 and layer 92 is N-type region 93, with an N-type impurity concentration of around $10^{17}$ or less atoms per cubic centimeter. Insulation layer 94 is formed on the surface of N-type region 93. Diffused into selected regions of N-type base region 93 through windows in insulation layer 94 are P-type regions 101 and 103, together with N+ region 102. Annular-shaped region 101 is the collector of the device and encircles P+ emitter region 103. N+ region 102 serves as an ohmic contact to epitaxially-grown base region 93. Metal contacts 104 and 95 are evaporated onto the emitter and base regions respectively. A metal contact layer consisting of metal portions 97, 98 and 99 is evaporated onto portions of the surfaces of collector region 101 and the base region 93 of the device. Portion 98 of this metal contact overlies the N-type base region 93 and forms a Schottky Barrier with this base region. Portion 97 of this metal contact extends over insulation 94 to increase the breakdown voltage of the Schottky Barrier and to collect contaminant ions on the surface of, or within, this insulation. Portion 99 of this metal contact overlies collector region 101 and forms the contact to this collector region. Thus the PNP transistor shown in FIG. 4 has a Schottky Barrier device in parallel with the collector-base junction.

A prototype of the device shown in FIG. 4 was made. Because of the presence of the Schottky Barrier, in parallel with the collector-base junction, this device was switched from the on to the off state in less than 2.5 nanoseconds. Measurements were limited not by the speed of the switching, but rather by the resolution of the measuring equipment.

In producing the Schottky Barrier, the surface of the semiconductor substrate was carefully cleaned by etching in HF acid (10 parts de-ionized water, 1 part HF acid) for a selected time to remove any surface oxidation over the contact area.

While the metal used in the prototype device for the contact layers and the Schottky Barrier metal was aluminum, other metals such as platinum, gold, molybdenum and nickel, which form high potential barriers with N-type semiconductors, are, of course, appropriate for use in Schottky Barrier devices. Moreover, while silicon was used for the underlying substrate in the prototype device, other semiconductor materials such as germanium and gallium arsenide can, if desired, be used in Schottky Barrier devices.

We claim:

1. A fast-switching transistor comprising:

a P-type collector region with an impurity concentration ranging from $10^{14}$ to $10^{17}$ atoms per cubic centimeter;

an N-type base region epitaxially-grown on said P-type collector region with an impurity concentration no greater than about $10^{17}$ atoms per cubic centimeter;

a P-type emitter region diffused into, and forming a PN junction with said epitaxially-grown N-type region, said emitter region having an impurity concentration of approximately $10^{19}$ atoms per cubic centimeter;

selected ohmic contacts to said emitter, said base and said collector regions;

a Schottky Barrier diode connecting said base region to said collector region, said Schottky Barrier diode comprising a metal layer attached to adjacent portions of both said P-type collector region and said epitaxially-grown N-type base region, thereby to form a Schottky Barrier junction with said N-type base region and an ohmic junction with P- type collector region; and a $P^+$ guard ring diffused into said N-type base region beneath one edge of said Schottky Barrier contact, thereby to shape the electric field in said N-type base region to improve the breakdown voltage of said Schottky Barrier junction.

2. Structure as in claim 1 wherein said ohmic contacts comprise a metal selected from the group consisting of aluminum, gold, nickel, platinum and molybdenum and said metal layer likewise comprises a metal selected from this same group of metals.

3. Structure as in claim 2 wherein said collector, base and emitter regions comprise selectively doped silicon, said ohmic contacts comprise aluminum, and said metal layer comprises aluminum.

4. A fast switching transistor comprising:

a P-type collector region with an impurity concentration ranging from $10^{14}$ to $10^{17}$ atoms per cubic centimeter;

an N-type base region epitaxially-grown on said P-type collector region with an impurity concentration no greater than about $10^{17}$ atoms per cubic cubic centimeter;

a P-type emitter region diffused into, and forming a PN junction with said epitaxially-grown N-type region, said emitter region having an impurity concentration of approximately $10^{19}$ atoms per cubic centimeter;

selected ohmic contacts to said emitter, said base and said collector regions;

a Schottky Barrier diode connecting said base region to said collector region, said Schottky Barrier diode comprising a metal layer attached to adjacent portions of both said P-type collector region and said epitaxilally-grown N-type base region, thereby to form a Schottky Barrier junction with said N-type base region and an ohmic junction with said P-type collector region; and an extension of said metal layer on insulation over a portion of said epitaxially grown N-type base region, thereby to shape the electric field in said N-type base region to improve the breakdown voltage of said Schottky Barrier junction.

5. A fast-switching transistor comprising:

a P+-type collector region;

an N-type base region epitaxially-grown on said P+-type collector region;

a P+-type emitter region diffused into, and forming a PN junction with said epitaxially-grown N-type region;

a P+-type collector contact region diffused through said epitaxially-grown N-type region into contact with said P+-type collector region;

selected ohmic contacts to said emitter, said base and said collector contact regions;

a Schottky Barrier diode connecting said base region to said collector region, said Schottky Barrier diode comprising a metal layer attached to adjacent portions of both said P+-type collector contact region and said epitaxially-grown N-type base region, thereby to form a Schottky Barrier junction with said N-type base region and an ohmic junction with said P+-type collector contact region; and an extension of said metal layer on insulation over a portion of said N-type base region, thereby to shape the electric field in said N-type base region to improve the breakdown voltage of said Schottky Barrier junction.